United States Patent
Rodrigues et al.

(10) Patent No.: US 11,894,796 B2
(45) Date of Patent: Feb. 6, 2024

(54) ROOF INTEGRATED SOLAR POWER SYSTEM WITH TOP MOUNTED ELECTRICAL COMPONENTS AND CABLES

(71) Applicant: BMIC LLC, Dallas, TX (US)

(72) Inventors: Tommy F. Rodrigues, Nutley, NJ (US); Sudhir Railkar, Wayne, NJ (US); Daniel E. Boss, Murphy, TX (US); David J. Gennrich, Fitchburg, WI (US); Cory Boudreau, Lake Elmo, MN (US); Daniel R. Nett, Sun Prairie, WI (US); Kent J. Kallsen, Jefferson, WI (US)

(73) Assignee: BMIC LLC, Dallas, TX (US)

( * ) Notice: Subject to any disclaimer, the term of this patent is extended or adjusted under 35 U.S.C. 154(b) by 32 days.

(21) Appl. No.: 16/171,819

(22) Filed: Oct. 26, 2018

(65) Prior Publication Data
US 2019/0123679 A1    Apr. 25, 2019

Related U.S. Application Data

(63) Continuation-in-part of application No. 14/044,196, filed on Oct. 2, 2013, now Pat. No. 10,115,850.
(Continued)

(51) Int. Cl.
*H02S 20/23* (2014.01)
*H02S 40/32* (2014.01)
(Continued)

(52) U.S. Cl.
CPC ............. *H02S 20/23* (2014.12); *F24S 25/40* (2018.05); *H01L 31/02008* (2013.01);
(Continued)

(58) Field of Classification Search
CPC ...... H01L 31/0482; H02S 40/32; H02S 20/23; H02S 40/30; F24S 25/40; H02G 3/14
(Continued)

(56) References Cited

U.S. PATENT DOCUMENTS 6,128,888 A * 10/2000 Gambetti ................ B65B 11/10
53/589
7,819,114 B2  10/2010 Augenbraun et al.
(Continued)

FOREIGN PATENT DOCUMENTS

WO    WO 2011-049944 A1    4/2011

OTHER PUBLICATIONS

SolarGain: Solar Energy Specialists, "APS—Micro Inverter Technology," http://www.solargain.com.au/aps-micro-inverter, Apr. 10, 2013.
(Continued)

*Primary Examiner* — Kourtney R S Carlson
(74) *Attorney, Agent, or Firm* — GREENBERG TRAURIG, LLP

(57) ABSTRACT

A roof integrated solar power system includes a plurality of solar modules. Each solar module carries a photovoltaic or solar panel with solar cells. Edge regions of the solar module are disposed to the sides of the solar panel and are devoid of solar cells. An electrical component such as a junction box or micro-inverter, or DC optimizer is mounted on top of the solar module within at least one of the edge regions. Cabling for interconnecting the electrical component to electrical components of others of the plurality of solar modules also is located within the side regions. In one embodiment, the electrical component and cabling is disposed within a recess within a side region and covered by a flat access panel. In another embodiment, the electrical component and cabling is located atop the side region and is covered by an access (Continued)

panel in the form of a protective cover strip. The solar modules are installable on a roof in aligned or staggered courses to form the solar power system, and with the installed courses of modules together forming a water barrier protecting the roof.

8 Claims, 5 Drawing Sheets

Related U.S. Application Data

(60) Provisional application No. 61/708,822, filed on Oct. 2, 2012.

(51) Int. Cl.
    *H02S 40/36*     (2014.01)
    *H02S 40/34*     (2014.01)
    *H01L 31/02*     (2006.01)
    *H01L 31/042*     (2014.01)
    *H02S 30/00*     (2014.01)
    *F24S 25/40*     (2018.01)
    *F24S 25/00*     (2018.01)
    *F24S 25/60*     (2018.01)
    *F24S 20/00*     (2018.01)

(52) U.S. Cl.
    CPC ............ *H01L 31/042* (2013.01); *H02S 30/00* (2013.01); *H02S 40/32* (2014.12); *H02S 40/34* (2014.12); *H02S 40/36* (2014.12); *F24S 2020/13* (2018.05); *F24S 2025/022* (2018.05); *F24S 2025/6007* (2018.05)

(58) Field of Classification Search
    USPC ................................................ 136/242–265
    See application file for complete search history.

(56) References Cited

U.S. PATENT DOCUMENTS

| | | | |
|---|---|---|---|
| 7,824,191 B1 | 11/2010 | Browder | |
| 8,312,693 B2 * | 11/2012 | Cappelli | H02S 20/25 52/173.3 |
| 8,371,076 B2 | 2/2013 | Jones et al. | |
| 8,505,249 B2 | 8/2013 | Geary | |
| 8,946,544 B2 | 2/2015 | Jacobs et al. | |
| 9,171,991 B2 | 10/2015 | Pearce et al. | |
| 9,711,672 B2 | 7/2017 | Wang | |
| 9,991,412 B2 | 6/2018 | Gonzalez et al. | |
| 10,027,273 B2 | 7/2018 | West et al. | |
| 2002/0017900 A1 * | 2/2002 | Takeda | H02S 20/23 136/291 |
| 2003/0217768 A1 * | 11/2003 | Guha | H02S 20/23 136/244 |
| 2006/0042683 A1 | 3/2006 | Gangemi | |
| 2009/0114261 A1 | 5/2009 | Stancel et al. | |
| 2009/0159118 A1 * | 6/2009 | Kalkanoglu | H02S 20/23 136/251 |
| 2010/0101634 A1 | 4/2010 | Frank et al. | |
| 2010/0269891 A1 * | 10/2010 | Kinard | H02S 20/23 136/251 |
| 2011/0030761 A1 * | 2/2011 | Kalkanoglu | H01L 31/048 136/245 |
| 2011/0036386 A1 | 2/2011 | Browder | |
| 2011/0048507 A1 | 3/2011 | Livsey et al. | |
| 2011/0058337 A1 | 3/2011 | Han | |
| 2011/0132427 A1 | 6/2011 | Kalkanoglu et al. | |
| 2011/0302859 A1 | 12/2011 | Crasnianski | |
| 2012/0212065 A1 | 8/2012 | Cheng et al. | |
| 2012/0233940 A1 | 9/2012 | Perkins | |
| 2012/0240490 A1 | 9/2012 | Gangemi | |
| 2013/0014455 A1 | 1/2013 | Grieco | |
| 2014/0182651 A1 * | 7/2014 | Rogerson | H01L 31/0201 136/244 |
| 2016/0359451 A1 | 12/2016 | Mao et al. | |
| 2017/0002568 A1 * | 1/2017 | Rumsey | E04D 13/103 |
| 2017/0159292 A1 | 6/2017 | Chihlas et al. | |
| 2018/0094438 A1 | 4/2018 | Wu et al. | |

OTHER PUBLICATIONS

Wholesale Solar, "AUO AC Unison PM250MA0 250-watt AC Solar Panel," http://www.wholesalesolar.com/products.folder/module-folder/AUO/AC-Unison-PM250MA0.html, Apr. 10, 2013.
Picture of powerhouse-solar-shingles.
Picture of Direct-to-Deck Solar Shingles being installed.
Picture of DowPowerHouse Roof.
Picture of two Flexible Shingles.

* cited by examiner

U.S. Patent  Feb. 6, 2024  Sheet 1 of 5  US 11,894,796 B2
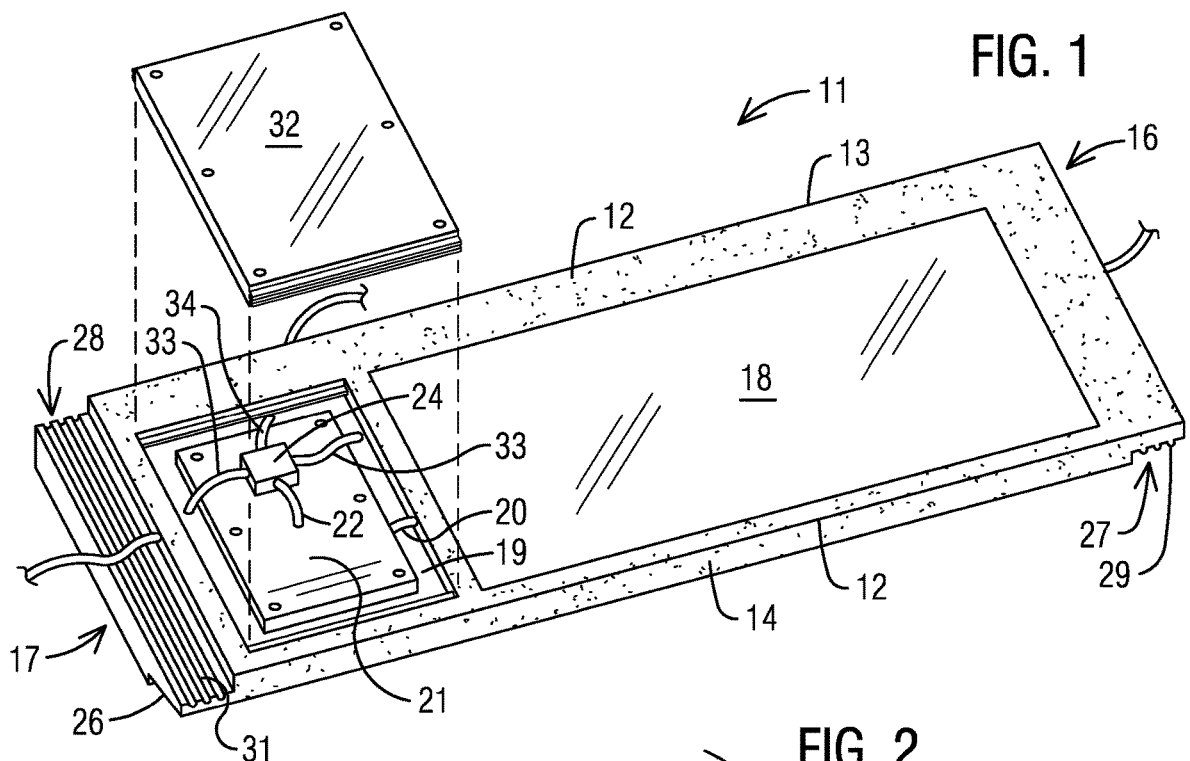
FIG. 1
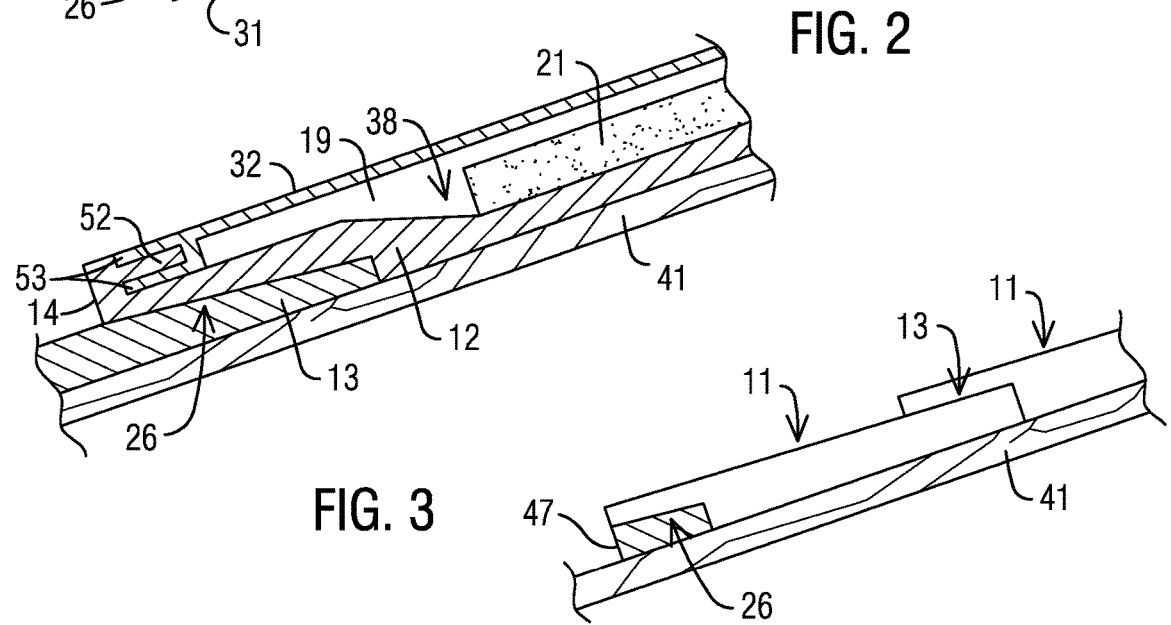
FIG. 2
FIG. 3
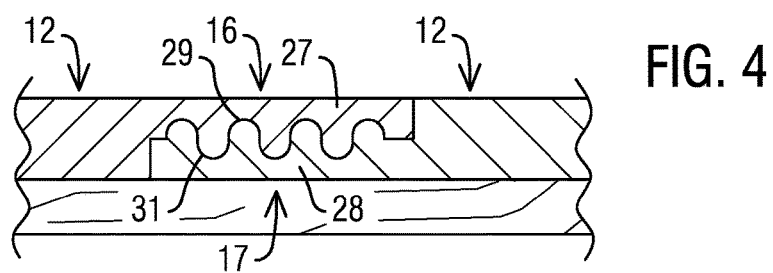
FIG. 4

ROOF INTEGRATED SOLAR POWER SYSTEM WITH TOP MOUNTED ELECTRICAL COMPONENTS AND CABLES

RELATED APPLICATIONS

This is a continuation-in-part of U.S. patent application Ser. No. 14/044,196 filed on Oct. 2, 2013 and entitled Roof Integrated Solar Panel System with Side Mounted Micro Inverters, which claims the benefit of U.S. Provisional Patent Application No. 61/708,822, filed on 2 Oct. 2012, and entitled "Roof Integrated Solar Panel System with Side Mounted Micro Inverters." The disclosures of these prior applications are hereby incorporated by reference in their entireties.

TECHNICAL FIELD

This disclosure relates generally to photovoltaic energy production and more specifically to solar panels and associated solar power systems configured to be mounted on the roof of a building for producing electrical energy when exposed to sunlight.

BACKGROUND

Collecting energy directly from the sun has drawn more and more interest in the past several years as people and industries turn to more sustainable forms of energy production. One way to collect energy from the sun is through the use of photovoltaic panels that generate electrical energy when the panels are exposed to sunlight. Large numbers of such panels can be erected in an array and electrically interconnected to generate correspondingly large volumes of electrical energy. Such photovoltaic arrays have been used to supply electrical power for commercial manufacturing plants, wineries, commercial buildings, and even domestic buildings. Such systems unfortunately tend to be large, bulky, unsightly, and generally not aesthetically desirable for installation on the roof of one's home.

More recently, photovoltaic systems have been developed that are designed to be installed on the roof of a residential home and, when installed, to present a more pleasing and acceptable appearance. One example is the Powerhouse® brand solar shingle from Dow Solar, which is relatively flat, installed in a manner similar to normal asphalt shingles, and at least to some degree resembles ordinary shingles. These more recent systems, while a step in the right direction, have generally been less acceptable than expected for a number of reasons including their tendency to leak, their susceptibility to large reductions in efficiency when one or a few panels of the system are shaded, and the difficulty of detecting and replacing defective panels and/or defective electrical connections beneath the panels. These systems generally also require large inverters in a garage or other location that convert the direct current (DC) electrical energy generated by the panels to alternating current (AC) electrical energy for connection to the public grid.

A need persists for a roof integrated solar power system that addresses the above and other problems and shortcomings, that is suitable in appearance and function for use on the roofs of residential homes, and that is easily installed and easily serviced when necessary. It is to the provision of such a system that the present invention is primarily directed.

SUMMARY

Briefly described, a roof integrated solar power system is disclosed for installation on the roof of a residential home to produce electrical energy when exposed to the sun. By "roof integrated" it is meant that the system also functions as the roofing membrane or water barrier of the building to shed water and protect the roof deck. The system comprises a plurality of solar modules that may or may not include a frame, a photovoltaic or solar panel comprising a plurality of solar cells on the module, and an electronics compartment or region located to one side of the solar panel. The electronics compartment or region is generally formed in or accessible from the top surface of the solar module.

In one embodiment, a micro-inverter is mounted in the electronics compartment and is electrically connected to the solar panel of the module to convert the DC energy produced by the solar panel to AC energy for distribution. Also located in the electronics compartment or region and accessible from the top surface of the solar module is an electrical connection block for coupling the AC energy from the micro-inverter of the module to AC energy generated by others of the plurality of modules in the solar power system. The aggregated AC electrical energy generated by the plurality of solar modules can then be delivered to the public electrical grid, used directly to power appliances, or stored in a battery bank for later use.

In another embodiment, the solar modules are frameless and are attached directly to the roof deck with appropriate fasteners. Each module of this embodiment has a top surface that faces away from a roof on which it is mounted. A solar panel comprising an array of solar cells is disposed on the upper surface of the module and edge portions to the sides of the solar panel that are devoid of solar cells. One or more electrical components, such as a junction box, DC optimizer, smart junction box, and/or a micro-inverter, are disposed within the edge portions on top of the module.

Cables also are located within the edge portions on top of the module for interconnecting the electrical components of one module to those of adjacent modules in the solar power system. An access panel in the form of a protective cover strip is configured to be attached to adjacent modules extending along their edge portions. The protective cover strip covers, protects, and provides access to the electrical components and cables within the edge portions atop the solar modules.

These and other features, aspects, and advantages of the system of this disclosure will become more apparent upon review of the detailed description set forth below when taken in conjunction with the accompanying drawing figures, which are briefly described as follows.

BRIEF DESCRIPTION OF THE DRAWINGS

FIG. 1 is a perspective partially exploded view of one module of a roof integrated solar panel system according to one embodiment of the invention.

FIG. 2 is a partial cross sectional view along line 2-2 of FIG. 1*a* showing the electronics compartment and a micro-inverter, wiring, and connection block contained therein.

FIG. 3 is a side elevational view of two modules of the roof solar panel system illustrating a starter strip and a head lap between courses of solar panel modules.

FIG. 4 is a partial cross sectional view along line 4-4 of FIG. 1*a* showing a water managing shiplap joint at the ends of two solar panel modules.

DETAILED DESCRIPTION

Figure 1A:
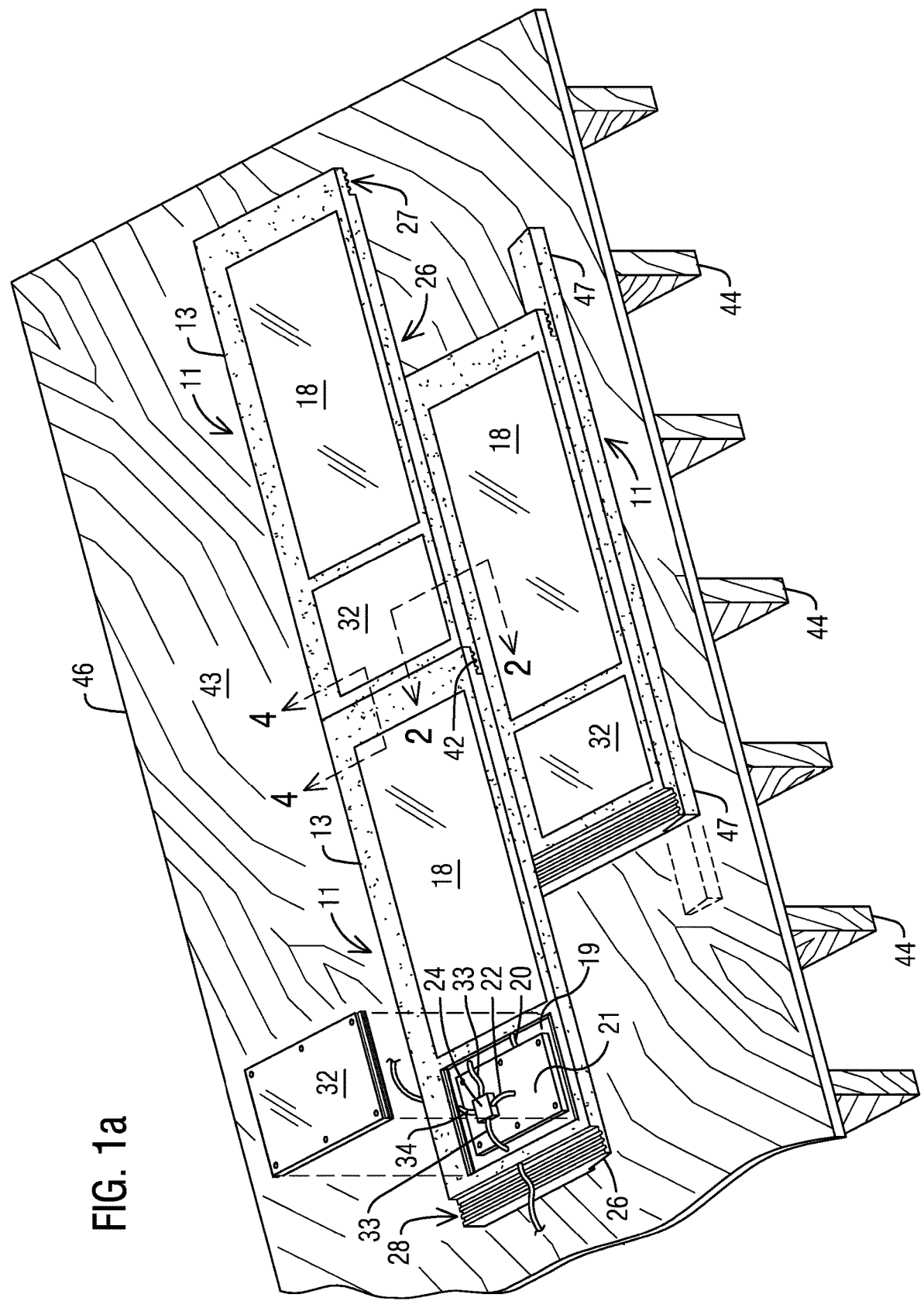
FIG. 1*a* is a simplified perspective illustration of a roof integrated solar panel system comprising a plurality of modules according to FIG. 1 mounted on a roof deck.

Referring now in more detail to the drawing figures, wherein like reference numerals, where appropriate, indicate like parts throughout the several views, FIG. 1 illustrates one embodiment of a single solar module 11 of a roof integrated solar panel system according to the invention. The module 11 of this embodiment comprises a frame 12 that can be made of any appropriate material such as, for instance, molded or extruded plastic, aluminum, a polymer composite material, or other material resistant to sun and the weather. The frame has a rear edge portion 13, a front edge portion 14, a right end portion 16, and a left end portion 17. A photovoltaic panel 18 is mounted to or recessed in the top surface of the frame for exposure to sunlight. The photovoltaic panel 18 may conventionally comprise an array of solar cells electrically connected together to form the panel or may comprise any type of photovoltaic technology capable of converting solar energy to electrical energy. The photovoltaic panel 18 may be covered with a protective material such as glass, a polymer, an epoxy, or similar material to protect the photovoltaic panel from the elements and to inhibit water leakage.

The frame 12 of this embodiment is further formed to define a recessed electronics compartment 19 spaced from one end of the photovoltaic panel, and that is formed in or accessible from the top surface of the frame. A micro-inverter 21 or other electrical component such as a junction box, smart junction box, or DC optimizer is contained within the electronics compartment 19 and is connected through a wire 20 to the photovoltaic panel 18 of the module. The micro-inverter, which is a commercially available product available from a number of suppliers such as, for example, Enphase Energy of Petaluma, Calif., functions to convert DC energy produced by the photovoltaic panel 18 to AC energy, preferably at a common frequency such as 60 cycles per second (Hz). Doing the DC-AC conversion on the module itself has been found to be more efficient than directing aggregated DC electrical energy from a plurality of solar panels to a remotely located large capacity inverter somewhere else in a home.

The AC output of the micro-inverter is directed through wire 22 to AC connection block 24, also located within the electronics compartment 19 and accessible from the top surface of the frame. The AC connection block 24 is configured to allow the AC output of other modules of the system to be interconnected so that the AC outputs of all the modules is can be aggregated into a single AC output that can be connected to the electrical grid, power appliances, or otherwise used. For example, wire 33 may connect to the AC connection block 24 from the micro-inverter of the next adjacent module of the system while wire 34 may connect to the AC connection block of a module in a next higher course of modules in a system. In this way, the AC output of each module is aggregated and can be applied through a trunk line to its eventual use.

A removable access panel 32 is sized and configured to be mounted to the top of the module covering the electronics compartment to provide aesthetic appeal and to protect components in the electronics compartment. The access panel 32 is accessible from the top surface of the frame. The access panel 32 can be made to match the frame 12 or the photovoltaic panel 18 in appearance if desired, or it may be configured to contrast with the frame or photovoltaic panel. In one aspect, the top surface of the access panel 32 can be substantially flush with the top surface of the photovoltaic panel 18, and both the top surface of the access panel 32 and the top surface of the photovoltaic panel 18 may or may not be substantially flush with the top surface of the frame 12.

The right end portion 16 of the frame 12 in this embodiment is formed with a laterally extending overlap 27 having channels 29 formed on its underside. Similarly, the left end portion 17 of the frame 12 is formed with a laterally extending underlap 28 also having channels 31 formed therealong. The channels 31 are configured to engage and mesh with the channels 27 when two modules of the system are connected end-to-end as described in more detail below. A tapered recess 26 is formed along the underside of the front edge portion 14 of the frame 12. As detailed below, the recess 26 is sized and configured to receive rear edge portion 13 of a like module 11 in a next lower course of modules of a system. As a result, the modules can form a water barrier when assembled together on a roof deck that also provides water shedding during rain that protects the roof.

It will be appreciated that when a plurality of modules 11 are installed on a roof, the thickness of each module can be minimized to improve aesthetics since the micro-inverters are not mounted on the backs of the photovoltaic panels but rather to their sides and are accessible from the top of the frame. Further, if a micro-inverter of a module should fail or an AC connection block should require access, it is a simple matter to remove the corresponding access panel 32, make the needed repairs, and replace the access panel. An entire module also can be replaced if defective simply by removing the access panel disconnecting the module at the connection block, moving it, replacing it with a new module, and rewiring the new module within the electronics compartment. This is in stark contrast to traditional solar shingles, which must be removed from the roof deck to effect repairs and are not easily replaced when defective.

FIG. 1a shows a roof integrated solar power system comprising a plurality of solar panel modules 11 installed on the deck 43 of a roof. The roof deck in this illustration is plywood supported by roof rafters 44 and extends upwardly at a pitch to a roof ridge 46. Only three modules are shown in this illustration, but it should be understood that a typical system may include many more modules installed and interconnected as shown in FIG. 1 a. Two modules 11 are illustrated here in an upper course of modules while one module 11 is illustrated in a lower course of modules. For the lower and top right modules, the access panels 32 are shown attached and covering the electronics compartment 19 of these modules while the access panel 32 is shown removed from the electronics compartment of the upper left module. The two modules 11 of the top course are mounted end-to-end with the overlap 27 of the left module overlying and meshed with the underlap 28 of the right panel to form a shiplap. The modules may be secured to the roof deck 43 with nails, screws, or other fasteners (not shown) preferably driven through the upper edge or headlap portions of the modules and into the roof deck below. Fasteners also may be driven through other portions of the modules as needed.

As may be appreciated by one of skill in the art, the process of converting the DC electrical energy to AC electrical energy can produce significant heat. Consequently, positioning the micro-inverter 21 to one side of the photovoltaic panel 18, rather than on the back or below the photovoltaic panel, can be advantageous by relocating the heat source out from under photovoltaic components that may be affected by higher ambient temperatures. As a result, the modules 11 can be installed directly to the deck 43 of the roof rather than elevated on a frame above the deck, as with some prior art systems, to provide ventilation for electrical modules that are mounted on the backs or below the photovoltaic panels.

The upper edge or headlap portion of the module 11 in the lower course is shown received within the recess 26 of the upper course of modules. In this way, the lower edge portions of the upper course of modules overlaps the headlap portions of a lower course of shingles to facilitate water shedding. A starter strip 47 is affixed to the roof deck along the forward edges of a lowermost course of modules and fills the recesses 26 of these modules. The starter strip may be formed of any appropriate material such as plastic, wood, a composite, or other material and extends along the lower edges of the lowermost course of modules to provide a substrate to which the lowermost course of modules may be affixed along their forward edges. Sealant may be applied between the starter strip 47 and the modules to inhibit windblown water from penetrating beneath the lowermost course of modules. The wiring 20, 33, and 34 as well as any additional wiring may easily be routed through the frames 13 of the modules and all electrical connections are made within the electronics compartments 19 during installation of a system of modules.

FIG. 2 is a partial cross-sectional view taken along line 2-2 of FIG. 1a illustrating one configuration of the electronics compartment of a module according to this embodiment of the invention. The frame 12 of the module 11 is shown resting on a roof deck 41 with the rear or headlap portion 13 of a next lower module received in the recess 26. The frame 12 of the upper module 11 is formed with a recessed area 38 that defines the electronics compartment 19. A micro-inverter 21 in this case is shown disposed within the electronics compartment fastened to the floor of the recessed area in this case. Access panel 32 is shown covering the electronics compartment. Preferably, the recessed area is formed such that an air space surrounds the micro-inverter 21 within the compartment to facilitate cooling of the electronics compartment 19. In the illustrated embodiment, the access panel 32 has a forward edge formed with a pair of fingers 53 shaped to receive a tongue formed along the forward edge of the recessed area 38. In this way, the forward edge of the access panel is securely fixed to the frame and water leakage into the electronics compartment 19 along this edge is inhibited.

FIG. 3 illustrates the starter strip 47 and overlying arrangement of modules 11 in a solar power system of the present invention. As described above, the starter strip is fixed to the roof deck 41 and is received in the recess 26 of the lowermost course of modules of a system. The recesses along forward edges of modules in the next higher course of modules receives and overlaps the headlap portions of a lower course of modules to facilitate water shedding. FIG. 4 illustrates the end-to-end connection between two modules 11 in the same course of modules. The overlap portion 27 of the left module is formed along its bottom surface with a series of ridges and troughs that form grooves 29 extending along the underside of the overlap. Similarly, the underlap portion 28 of the right module is formed along its top surface with a series of complementing ridges and troughs that form grooves 31 extending along the upper surface of the underlap portion 28. When two modules are joined end-to-end as shown, the grooves mesh with each other as shown in FIG. 4. This, in turn, prevents water from migrating laterally across the shiplap joint formed by the overlap and underlap portions and thereby inhibits leakage between modules in a course of modules.

The roof integrated solar power system of this invention is installed on a roof deck as illustrated in FIG. 1a in courses. A starter strip is installed along the bottom edge of the installation and the first course of modules is installed against the starter strip. The next higher course of modules is then installed with the grooves 26 of the modules overlapping the rear edge or headlap portions of the lower course modules. Preferably, the modules of adjacent courses are staggered with respect to one another as shown in FIG. 1a to enhance the water shedding and leak resistant properties of the installed system. Any water that may seep into the shiplap joints of an upper course is directed along the grooves of the joint onto the mid portion of a lower module where it is shed away.

As each module is installed on a roof deck, or after installation of the entire system, the modules are electrically connected together. This is done using connector blocks 24 located within the electrical compartment 19. The connector blocks electrically connect the micro-inverters of each module in a course to the micro-inverters in other modules of the course through wires 33 that are hidden beneath the modules. Likewise, the micro-inverters of each course are connected to those of a next higher (or lower) course through wires 34 that also are hidden beneath the modules. In the preferred embodiment, the micro-inverters are electrically connected in parallel so that the total voltage of the system is substantially the same as the voltage of one of the micro-inverters while the electrical current capacity of the system is substantially the sum of the current capacities of all of the micro-inverters. The total electrical energy developed by the system can then be connected through a trunk wire, buss, or otherwise to the public electrical grid, to appliances in the home, or other destinations.

With the modules installed and wired, the electrical compartments of the modules are covered by their access panels 32 to complete the installation. The interface between the access panels and the top of the frame 12 can be made water tight if desired, so that the micro-inverter is positioned below the water barrier and water shedding is accomplished across the tops of the access panels during rain. Alternatively, water may be allowed to leak into the electrical compartments which may be provided with appropriate drainage systems or weep holes so that the micro-inverter is positioned above the water barrier and the water shedding is accomplished from within the electrical compartments. In the later case, vents may be formed in the access panels to vent heated air from within the electrical compartments to ambience to help maintain the temperature of the micro-inverters within acceptable ranges.

It will be appreciated, moreover, that with either configuration the primary water barrier provided by the frames 12 of the assembled solar power modules 11 may not be breached or interrupted during repairs, adjustments, or upgrades to the electrical components located with the electronics compartments 19, and that are accessible from the top of the modules 11.

Figure 5:
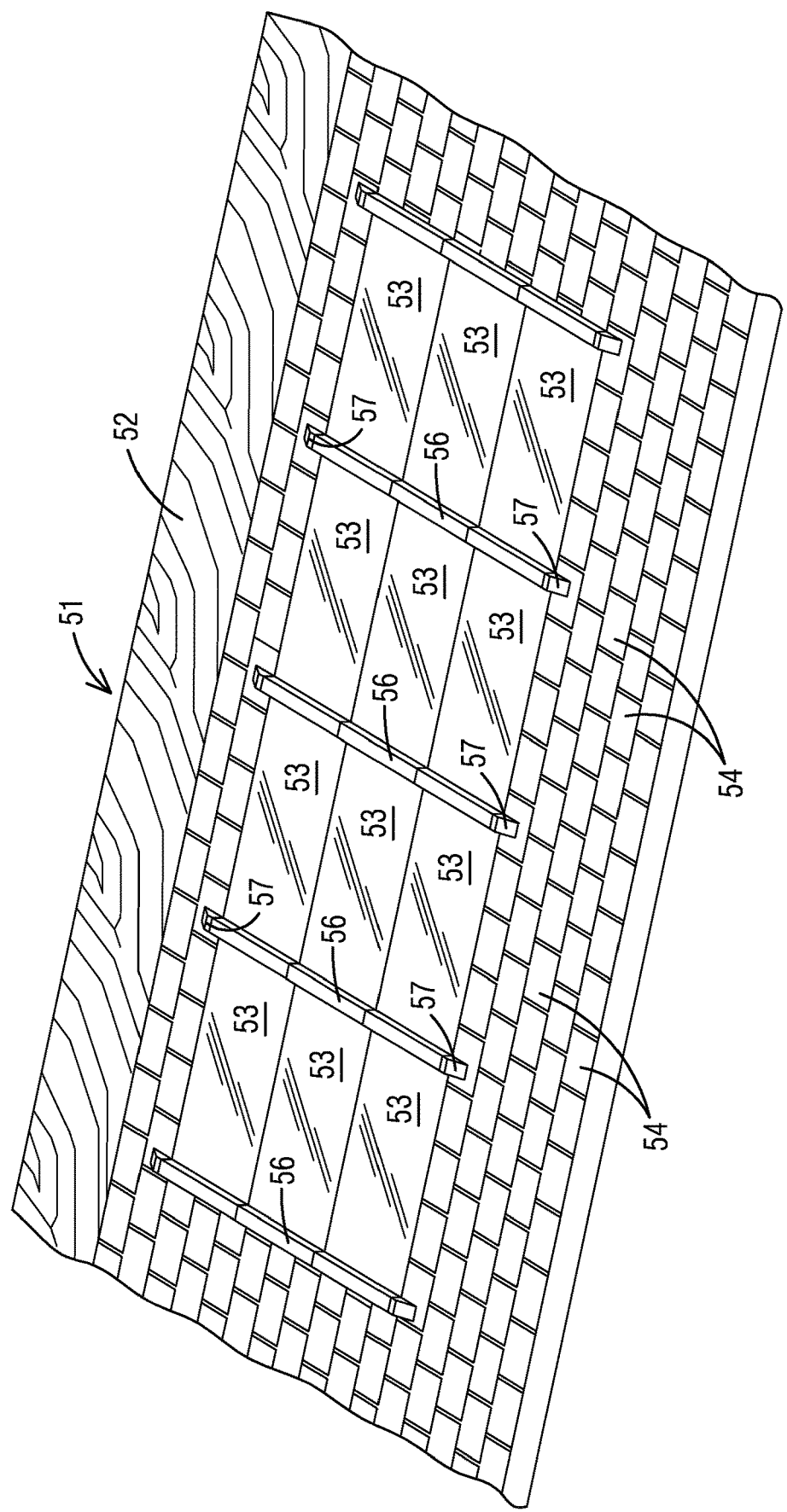
FIG. 5 is a perspective view of an alternate embodiment of the system incorporating direct-to-deck mounted solar panels with top mounted electrical components and wiring.
Figure 6:
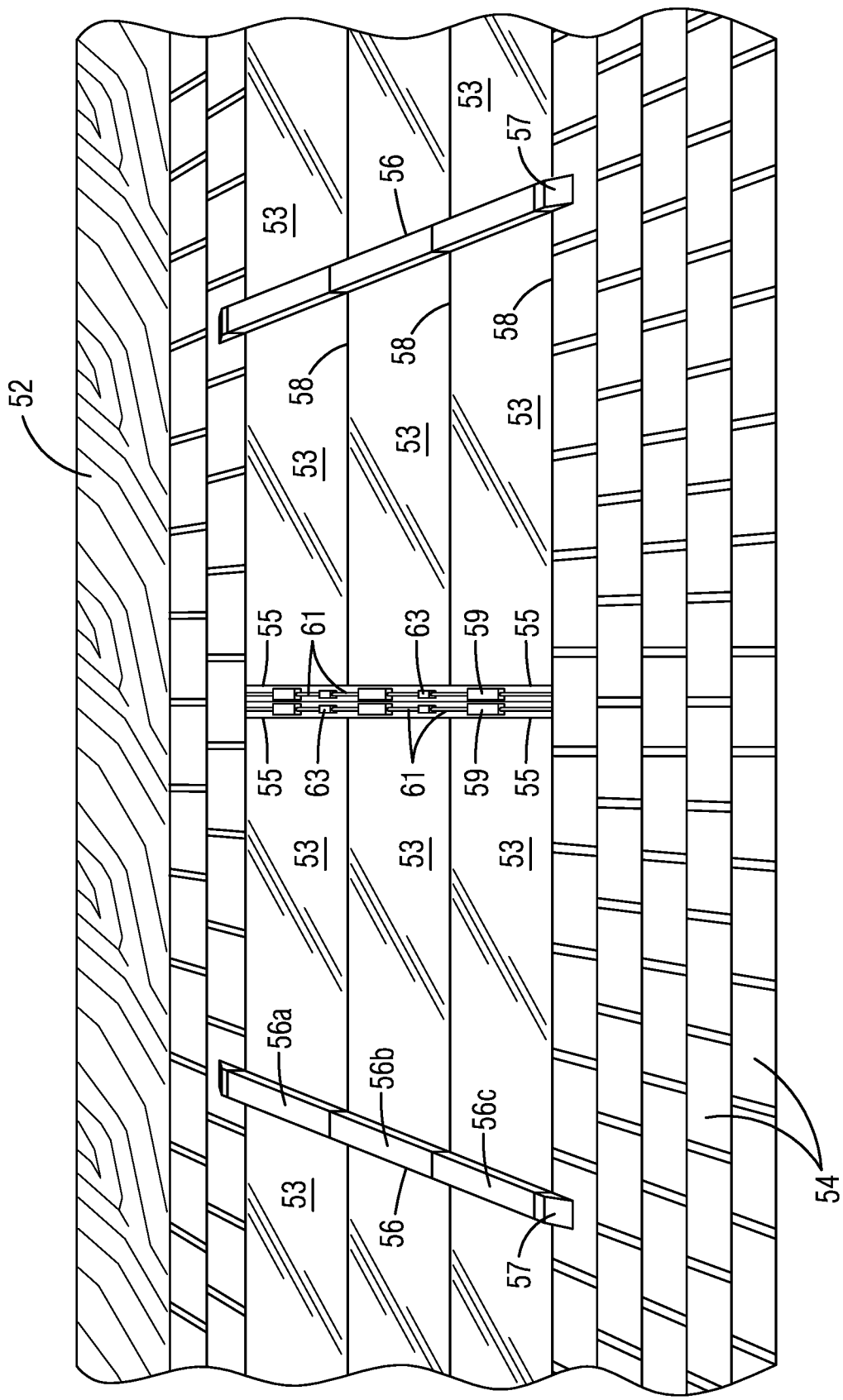
FIG. 6 is a front perspective view of the embodiment illustrated in FIG. 5 with one protective cover strip removed to reveal electronic components and wiring.
Figure 7:
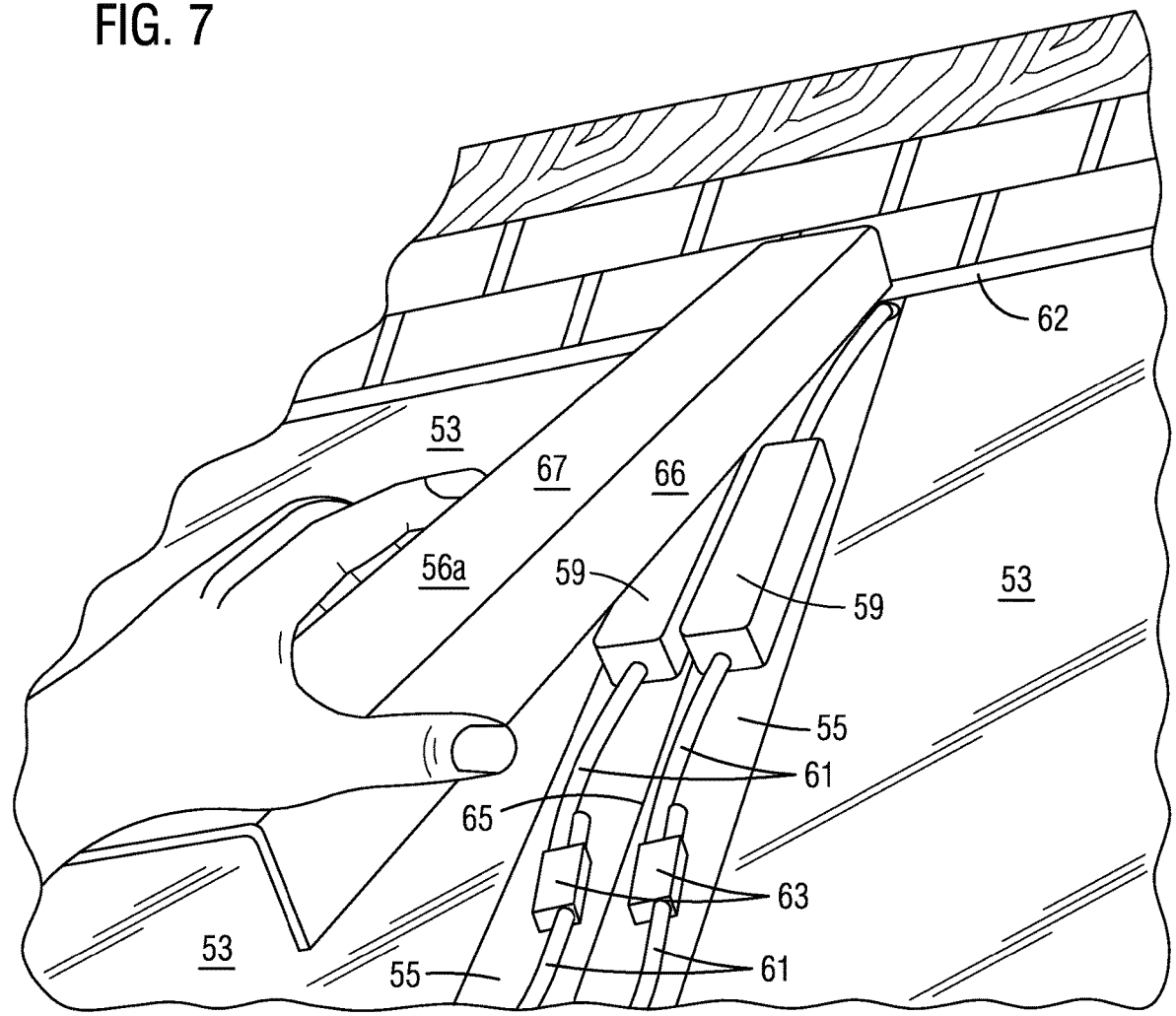
FIG. 7 is an enlarged perspective view showing a section of a protective cover strip being installed over electronic components and wiring of the solar panel system of FIG. 5.

FIGS. 5-7 illustrate a second or alternate embodiment of a solar power system wherein the solar modules also are mounted directly to a roof deck. Electrical junctions, electrical components, and cabling are disposed on top of and within edge portions of the solar modules. These electrical components are covered with access panels in the form of protective cover strips mounted to the modules. Referring first to FIG. 5, a roof integrated solar power system 51 is shown mounted to the roof deck 52 of a home or other structure. The solar power system 51 comprises a plurality of solar modules 53 arranged in a matrix, including a row-and-column array of solar modules positioned on the roof deck, with the row-and-column array of solar module shown in FIG. 5 including parallel rows of laterally aligned solar modules. Each solar module 53 has an upper surface that faces away from the roof. A solar panel bearing a plurality of solar cells for converting sunlight to electrical energy is disposed on the upper surface of the solar module. Edge portions 55 (FIGS. 6 and 7) are located to the sides of the solar panel and the edge portions preferably are barren of solar cells. As also illustrated in FIG. 5, the solar modules can be installed with abutting edge portions of solar modules in at least one adjacent column of solar modules along a common vertical plane to define a plurality of stacked columns of solar modules.

The solar modules in this embodiment are attached directly to the roof deck with appropriate fasteners. The modules may be framed or frameless solar modules or more preferably may be lightweight flexible solar modules such as those available from Rich Solar of Derrimut, Australia and others. In either case, the solar modules are mounted directly to the roof deck so that mounting rails and associated mounting hardware are not necessary. This greatly reduces the cost of the system. The illustrated embodiment shows the use of lightweight flexible solar modules 53 having grommets 58 for use in securing the modules to the roof. Of course, any other means for securing the solar modules directly to the roof are possible and all should be considered to be within the scope of the invention. Access panels 56 in the form of removable protective cover strips 56 cover the edges of side-by-side abutting solar modules for purposes detailed below.

FIG. 6 shows the solar power system 51 from its bottom edge with one of the protective cover strips 56 removed. Electrical components 59 are seen to be mounted to the top of each module to the sides of the solar panels and within the edge portions modules. These components can be simple junction boxes or more complicated items such as smart junctions, DC optimizers, or inverters that convert DC electrical energy to AC. Such components have become increasingly smaller over time and are suited for use with the present invention. The electrical components are electrically interconnected with electrical cables 61 to aggregate the electrical energy produced by the solar modules.

The protective cover strips 56 are sized and configured to overlie, cover, and protect the electrical components 59 and cables 61 but to be easily removable if needed for service or replacement of a solar module or its electrical components. In the illustrated embodiment, each protective cover strip 56 comprises multiple strip sections 56a, 56b, and 56c with the bottom ends of upper sections overlapping top ends of lower sections. This provides water shedding properties and makes it easier to handle, install, and remove the protective cover strips when necessary. End caps 57 may be used to cover and seal open ends of the cover strips. It will be seen that the cover strips 56 are mounted on the solar modules to the sides of the solar panels and covering the edge portions of the modules. The cover strips 56 also are raised above the upper surfaces of the solar modules to accommodate the electrical components and cabling below.

FIG. 7 is an enlarged view showing a protective cover strip section 56a being installed. Two solar modules 53 are seen attached directly to a roof deck and their edges abut one another along junction 65. Electrical components 59 are secured to the top of each solar module along the edge portions 55 and to the side of the solar panels that carry the solar cells. Cabling 61 extends from both ends of each of the electrical components and the cabling terminates in cable connectors 63. The cable connectors 63 are coupled to the cable connectors of lower and higher solar modules in a column of solar modules. In this way, the electrical energy produced by all solar modules in each column is aggregated.

Each electrically aggregated column can then be electrically coupled together to aggregate all of the electrical energy produced by the solar modules of the solar power system. This can be done at the top or bottom of the installation or somewhere in-between. For example, the electrical components of two side-by-side modules can be configured to couple together across the width of the installation. Once electrical connections and cable routing is complete, the protective cover strips 56 are installed over the electrical components, cabling, and connectors to protect them from the elements and to prevent rainwater from seeping through the junctions 65 between side-by-side solar modules. The protective cover strips can be secured with snaps, screws, spring clips, or any other technique for securing them removably to the solar modules. The top and bottom ends of the protective cover strips can be sealed with appropriate end caps 57.

Flashing 62 may be installed across the top of the installed solar power system to integrate it with surrounding shingles 54 and direct cascading water onto the tops of the solar modules. Flashing also may be used along the sides and the bottom edge of the installed system if desired.

The invention has been described herein in terms of preferred embodiments and methodologies considered by the inventor to represent the best modes of carrying out the invention. It will be understood by the skilled artisan; however, that a wide range of additions, deletions, and modifications, both subtle and gross, may be made to the illustrated and exemplary embodiments without departing from the spirit and scope of the invention disclosed herein.

What is claimed is:
1. A roof integrated solar power system comprising:
   a row-and-column array of a plurality of solar modules positioned on a roof deck, the row-and-column array of the plurality of solar modules comprising a plurality of parallel rows of laterally aligned solar modules;
   wherein each solar module of the plurality of solar modules comprises:
      an upper surface that faces away from the roof deck,
      a solar panel on the upper surface;
         wherein the solar panel comprises a plurality of solar cells; and
      edge portions located along opposite sides of the solar panel;
   wherein the solar modules are arranged with edge portions of solar modules in one column of solar modules abutting and not overlapping edge portions of solar modules in at least one adjacent column of solar modules;
   a first electrical component secured to the upper surface of each solar module along at least one of the edge portions of the solar module;

a second electrical component positioned along an opposing edge portion of one or more of the solar modules;

electrical cables configured to couple the electrical components of solar modules in each column of solar modules together to aggregate electrical energy produced by each solar module of the column; and a protective cover strip configured to cover and protect the electrical components and the electrical cables secured along opposing sides of the row and column array of solar modules, the cover strip comprising:
- a plurality of cover strip sections having top and bottom ends and arranged with the bottom ends of upper cover strip sections overlapping the top ends of lower cover strip sections to provide water shedding;
- wherein the cover strip sections are configured to releasably attach to abutting edge portions of the solar modules of side-by-side columns of solar modules.

2. A roof integrated solar power system as claimed in claim 1 wherein the solar modules and the solar panels are flexible.

3. A roof integrated solar power system as claimed in claim 1 wherein the solar modules are secured directly to the roof.

4. A roof integrated solar power system as claimed in claim 1 wherein the first electrical component comprises a smart junction box.

5. A roof integrated solar power system as claimed in claim 1 wherein the protective cover strip further comprises end caps mounted along opposite ends of the protective cover strip and configured to seal the opposite ends of the protective cover strip against penetration of water.

6. A roof integrated solar power system as claimed in claim 1 wherein the protective cover strip extends vertically between the side-by-side columns of solar modules and each of the cover strip sections comprises an inverted U-shaped profile that extends upwardly above a plane of each solar panel to cover and protect the electrical components and cables along the abutting edge portions of the side-by-side columns; and wherein the cover strip sections are configured to releasably attach to the abutting edge portions of the solar modules with snaps, screws, spring clips, or combinations thereof.

7. A roof integrated solar power system as claimed in claim 1, wherein at least one of the first and second electrical components comprises a junction box.

8. A roof integrated solar power system as claimed in claim 1, wherein at least one of the first and second electrical components comprises a micro-inverter or a DC optimizer.

* * * * *